US012593707B2

(12) United States Patent
Chen et al.

(10) Patent No.: US 12,593,707 B2
(45) Date of Patent: Mar. 31, 2026

(54) SEMICONDUCTOR STRUCTURE AND MANUFACTURING METHOD THEREOF

(71) Applicant: Taiwan Semiconductor Manufacturing Company, Ltd., Hsinchu (TW)

(72) Inventors: Ching-Wen Chen, Kaohsiung City (TW); Ming-Che Ho, Tainan City (TW); Hung-Jui Kuo, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 744 days.

(21) Appl. No.: 17/892,137

(22) Filed: Aug. 22, 2022

(65) Prior Publication Data

US 2024/0063101 A1    Feb. 22, 2024

(51) Int. Cl.
| | |
|---|---|
| *H01L 23/498* | (2006.01) |
| *H01L 21/48* | (2006.01) |
| *H01L 21/56* | (2006.01) |
| *H01L 25/18* | (2023.01) |
| *H01L 23/00* | (2006.01) |
| *H01L 23/28* | (2006.01) |

(52) U.S. Cl.
CPC .... *H01L 23/49822* (2013.01); *H01L 21/4853* (2013.01); *H01L 21/4857* (2013.01); *H01L 21/568* (2013.01); *H01L 23/49811* (2013.01); *H01L 25/18* (2013.01); *H01L 23/28* (2013.01); *H01L 24/13* (2013.01); *H01L 24/73* (2013.01); *H01L 2224/13147* (2013.01); *H01L 2224/13155* (2013.01); *H01L 2224/73204* (2013.01)

(58) Field of Classification Search
CPC ........... H01L 23/49822; H01L 21/4853; H01L 21/4857; H01L 23/49811; H01L 24/13; H01L 24/73
See application file for complete search history.

(56) References Cited

U.S. PATENT DOCUMENTS

| | | | |
|---|---|---|---|
| 9,000,584 | B2 | 4/2015 | Lin et al. |
| 9,048,222 | B2 | 6/2015 | Hung et al. |

(Continued)

FOREIGN PATENT DOCUMENTS

| | | |
|---|---|---|
| TW | 202230553 | 8/2022 |

OTHER PUBLICATIONS

"Office Action of Taiwan Counterpart Application", issued on Nov. 30, 2023, p. 1-p. 4.

*Primary Examiner* — Evan G Clinton
(74) *Attorney, Agent, or Firm* — JCIPRNET

(57) ABSTRACT

A structure including a redistribution structure comprising dielectric layers and conductive layers alternately stacked is provided, wherein a dielectric layer among the dielectric layers of the redistribution structure comprises a first surface, a conductive layer among the conductive layers of the redistribution structure comprising a second surface, and the conductive layer comprises a wiring layer and a seed layer; and an under-bump metallization (UBM) layer comprises a third surface, a fourth surface opposite to the third surface, and a sidewall surface extending from the third surface to the fourth surface, wherein a portion of the seed layer is between the wiring layer and the UBM layer, and the UBM is in contact with the dielectric layer.

20 Claims, 17 Drawing Sheets

(56)          References Cited

U.S. PATENT DOCUMENTS

| | | | |
|---|---|---|---|
| 9,048,233 | B2 | 6/2015 | Wu et al. |
| 9,064,879 | B2 | 6/2015 | Hung et al. |
| 9,111,949 | B2 | 8/2015 | Yu et al. |
| 9,263,511 | B2 | 2/2016 | Yu et al. |
| 9,281,254 | B2 | 3/2016 | Yu et al. |
| 9,368,460 | B2 | 6/2016 | Yu et al. |
| 9,372,206 | B2 | 6/2016 | Wu et al. |
| 9,496,189 | B2 | 11/2016 | Yu et al. |
| 2019/0013256 | A1* | 1/2019 | Lee ........................ H01L 24/82 |
| 2022/0037261 | A1* | 2/2022 | Choi ................... H01L 23/5385 |
| 2023/0060618 | A1* | 3/2023 | Lee .................... H01L 21/6835 |

* cited by examiner

SEMICONDUCTOR STRUCTURE AND MANUFACTURING METHOD THEREOF

BACKGROUND

Integrating multiple types of devices or components is a continuing objective in building integrated circuit and packages. The improvement of the design, structure or the manufacturing method of semiconductor substrate can incorporate with components such as memory chips, logic chips and so on, to form a system with a compact size. Currently, integrated fan-out packages are becoming increasingly popular for their compactness. In the integrated fan-out packages, the design of the electrical connection between components plays an important role during of the optimization of the system.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figures 1, 2:
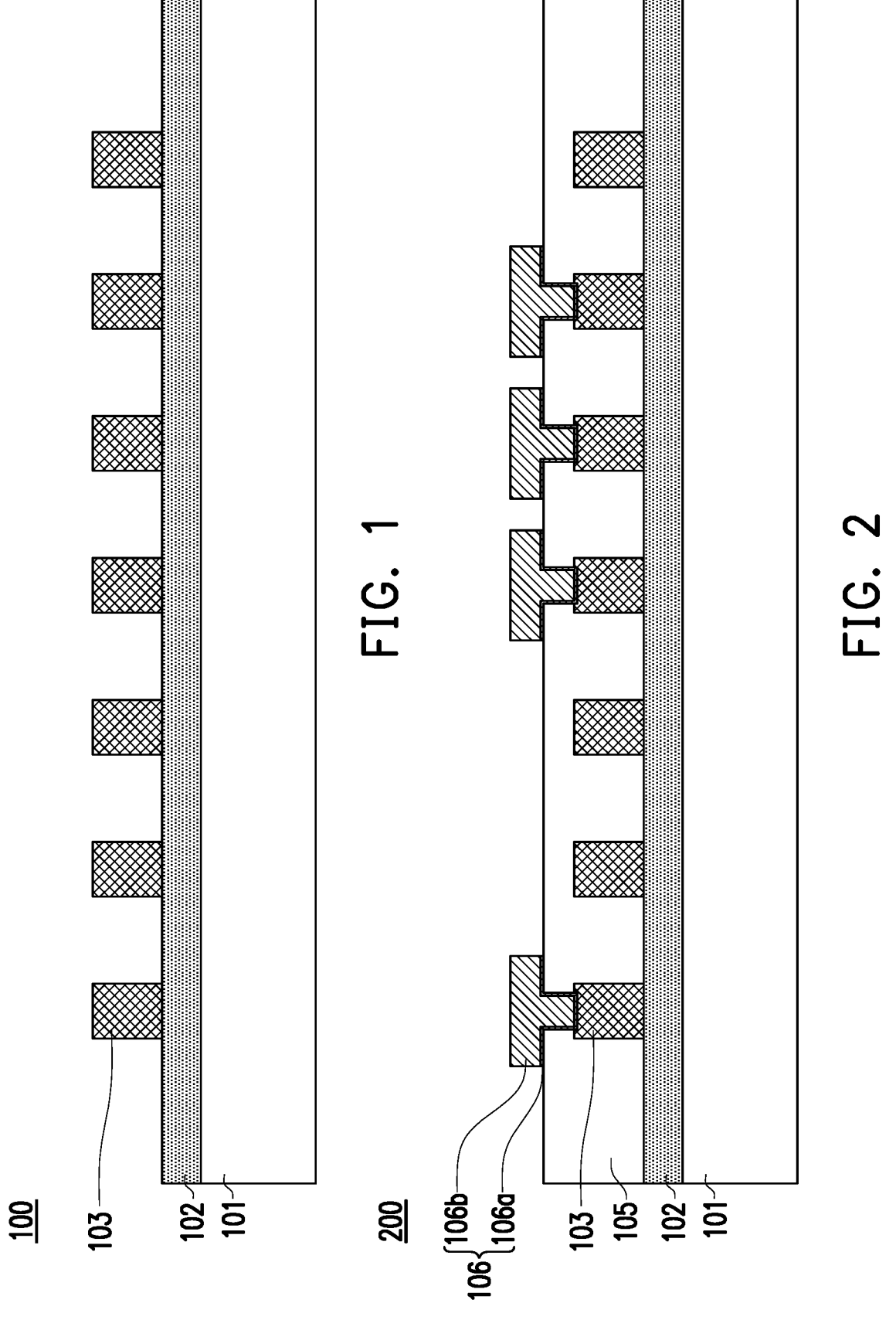
FIG. 1 through FIG. 10 illustrate a process flow for fabricating an integrated fan-out package in accordance with some embodiments.

The following disclosure provides many different embodiments or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be appreciated that the following embodiment(s) of the present disclosure provides applicable concepts that can be embodied in a wide variety of specific contexts. The embodiments are intended to provide further explanations but are not used to limit the scope of the present disclosure.

FIG. 1 through FIG. 10 illustrate a process flow for fabricating an integrated fan-out package in accordance with some embodiments.

Referring to FIG. 1, an intermediate structure 100 with a semiconductor substrate 101 having a de-bonding layer 102 formed thereon is provided, wherein the de-bonding layer 102 is formed on a surface of the semiconductor substrate 101. In some embodiments, the semiconductor substrate 101 is a glass substrate or a silicon substrate, and the de-bonding layer 102 is a light-to-heat conversion (LTHC) release layer formed on the semiconductor substrate 101. In alternative embodiments, the de-bonding layer 102 is a photo-curable release film whose viscosity is decreased by photo-curing process or a thermal curable release film whose viscosity is decreased by thermal-curing process. The materials of the de-bonding layer 102, the semiconductor substrate 101 are merely for illustration, and the disclosure is not limited thereto.

As shown in FIG. 1, in the intermediate structure 100, a under bump metallization (UBM) layer 103 with a plurality of pads is further formed. The UBM layer 103 is disposed over the de-bonding layer 102 and is then patterned into pad structures. In some embodiments, the UBM layer 103 includes Ti, Ta, Cu, W, Ru, Co, Ni or an alloy thereof. In some embodiments, the UBM layer 103 is formed for further electrical connection to some connectors of subsequently formed devices.

Referring to FIG. 2, a dielectric layer 105, a seed layer 106a and a wiring layer 106b are formed over the de-bonding layer 102 and the UBM layer 103 such that an intermediate structure 200 is formed. The seed layer 106a together with the wiring layer 106b are herein referred to a conductive layer 106 for providing a function of electrical connection in the structure. In some embodiments, the dielectric layer 105 is formed over the de-bonding layer 102 to cover the UBM layer 103. In some embodiments, the dielectric layer 105 includes polybenzoxazole (PBO), polyimide (PI), benzocyclobutene (BCB), a nitride such as silicon nitride, an oxide such as silicon oxide, phosphosilicate glass (PSG), borosilicate glass (BSG), boron-doped phosphosilicate glass (BPSG), a combination thereof or the like. In some alternative embodiments, the dielectric layer 105 is made of an inorganic material. The disclosure is not limited thereto.

The dielectric layer 105 may be formed through a deposition process followed by a patterning process. The dielectric layers 105 may be formed by suitable fabrication techniques such as spin-on coating, chemical vapor deposition (CVD), plasma-enhanced chemical vapor deposition (PECVD) or the like. In some embodiments, a patterning process includes a series of lithography processes comprising a coating method, an exposure process, a develop process and a curing method, and/or etching process may be performed on the dielectric layer 105. After performing the patterning process of the dielectric layer 105, openings are formed in the dielectric layer 105 so as to allow the succeeding formed conductive structures connect to other layers. In other words, portions of the UBM layer are revealed by the openings defined in the dielectric layer 105.

As illustrated in FIG. 2, a conductive layer 106 including a seed layer 106a and a wiring layer 106b is formed on the dielectric layer 105 and fills the openings defined in the dielectric layer 105. The seed layer 106a and the wiring layer 106b of the conductive layer 106 may be formed through deposition processes followed by a patterning process. In some embodiments, the seed layer 106a is conformally formed on the surface of the dielectric layer 105. In some embodiments, the seed layer 106a partially fills the openings defined in the dielectric layer 105 and covers portions (e.g., top surfaces) of the UBM layer 103 revealed by the openings defined in the dielectric layer 105. In some embodiments, the seed layer 106a is formed by a sputtering method, a deposition method such as physical vapor deposition or other applicable methods. In some embodiments, the above-mentioned patterning process includes a series of lithography processes comprising a coating method, an exposure process, a develop process and a curing method, and/or etching process may be performed on the dielectric layer 105. Through the specification, the seed layer 106a not only serves as a seed for the subsequently formed metal feature, but also provides adhesion between adjacent metal features. Specifically, the seed layer 106a not only serves as a seed for the subsequently formed wiring layer 106b of the conductive layer 106, but also provides sufficient adhesion between the wiring layer 106b and the underlying UBM layer 103. In some embodiments, the material of the seed layer 106a and the wiring layer 106b includes Ti, Ta, Cu, W, Ru, Co, Ni or an alloy thereof, or other suitable choice of materials. In some embodiments, the seed layer 106a includes Ti/Cu, and the wiring layer 106b includes Cu.

Figure 3:
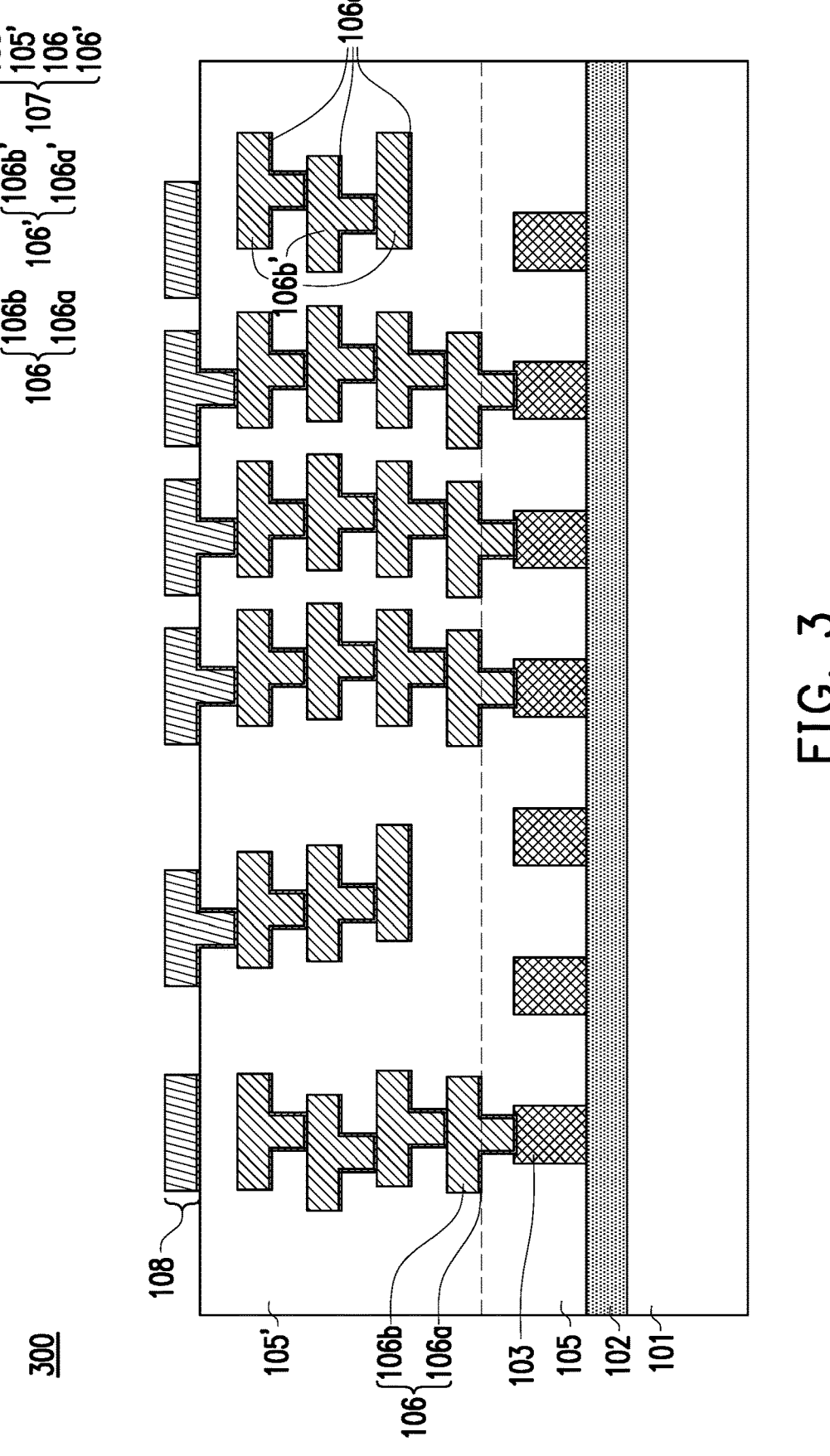

Referring to FIG. 3, in some embodiments, after the dielectric layer 105 and the conductive layer 106 are formed, the processes illustrated in FIG. 2 may be repeated at least one time to form dielectric layer(s) 105' and conductive layer(s) 106', wherein the dielectric layers 105, 105' and the conductive layers 106, 106' are collectively referred to a redistribution structure 107. The redistribution structure 107 is formed over the semiconductor substrate 101 to as to cover the de-bonding layer 102 and the UBM layer 103. The conductive layers 106, 106' of the redistribution structure 107 are electrically connected to the UBM layer 103. After forming the redistribution structure 107, an under bump metallization (UBM) layer 108 may be formed over the outer surface of the dielectric layer 105' to as to formed an intermediate structure 300. The material and fabrication processes of the dielectric layers 105' and the conductive layers 106' may be the same as those of the dielectric layers 105 and the conductive layers 106. The details of the dielectric layers 105 and the conductive layers 106 are thus omitted.

Figure 4:
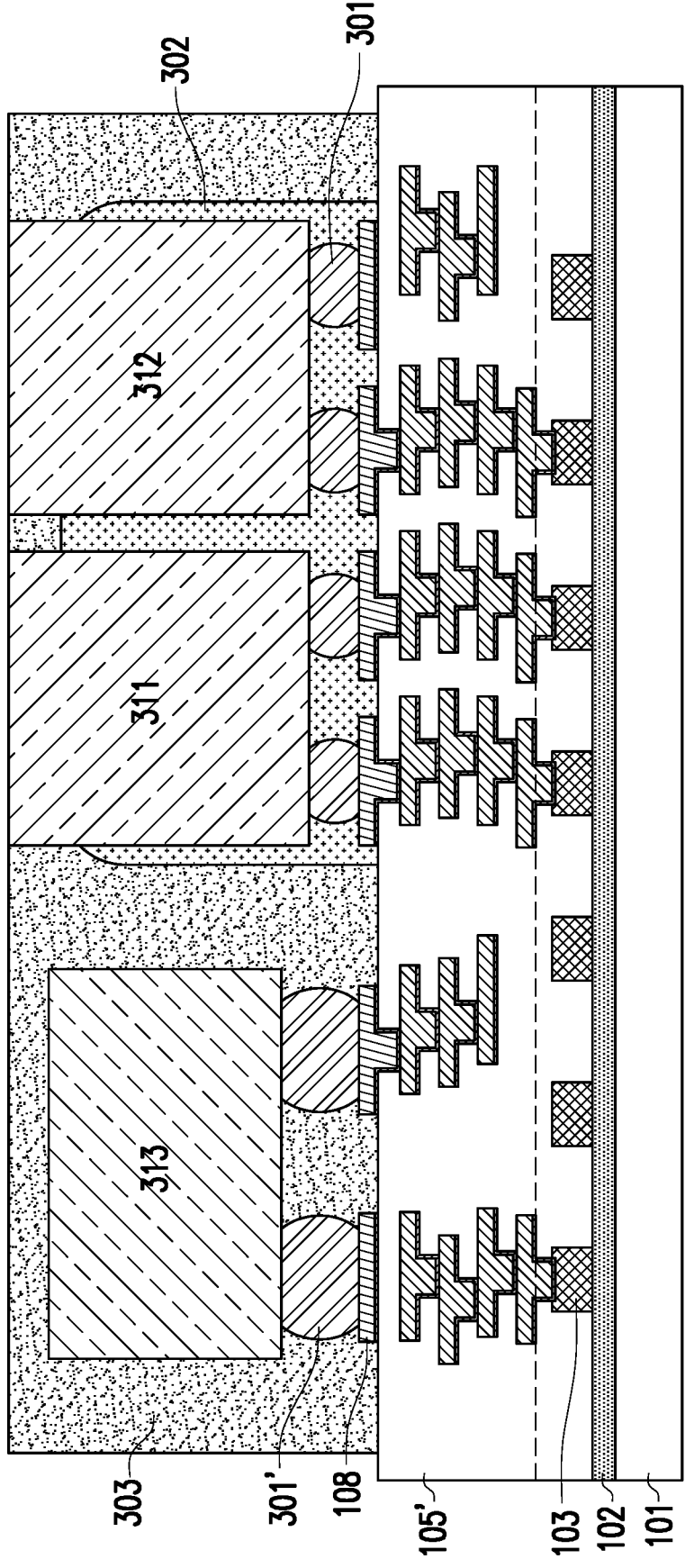

In FIG. 4, semiconductor dies 311, 312 and 313 may be picked-up and placed on the UBM layer 108, and a reflow process may be performed to mount the semiconductor dies 311, 312 and 313 on the UBM layer 108. Various types of semiconductor dies, such as an application-specific integrated circuit (ASIC) chip, an analog chip, a sensor chip, a wireless and radio frequency chip, a voltage regulator chip or a memory chip, can be chosen herein to form a desired system. In some embodiments, the semiconductor dies 311, 312 and 313 may include active components or integrated active devices (IAD). In some other embodiments, the semiconductor dies 311, 312 and 313 may include passive components or integrated passive devices (IPD). The semiconductor dies 311, 312 and 313 are electrically connected to the UBM layer 108. The semiconductor dies 311, 312 and 313 may be electrically connected to the redistribution structure 107 through the UBM layer 108. In some embodiments, the semiconductor dies 311, 312 and 313 are disposed on and electrically connected to the UBM layer 108 through connectors, such as conductive features 301, 301'. In some embodiments, the material of conductive features 301, 301' includes copper, solder, nickel or a combination thereof. As illustrated in FIG. 4, the conductive features 301 and 301' may be or include conductive bumps, wherein the height of the conductive features 301' is greater than the height of the conductive features 301. In some other embodiments, not illustrated in figures, the height of the conductive features 301' is less than or substantially equals to the height of the conductive features 301.

As illustrated in FIG. 4, an underfill 302 may be applied to fill the spaces in between the semiconductor dies 311 and 312. The underfill 302 may not only cover sidewalls of the semiconductor dies 311 and 312, but also fill the gap between the semiconductor die 311 and the redistribution structure 107 as well as the gap between semiconductor die 312 and the redistribution structure 107. The underfill 302 may be formed through a dispensing process followed by a curing process. In some embodiments, the underfill 302 laterally encapsulates the conductive connectors 301. In certain embodiments, the underfill 302 is spaced apart from the semiconductor die 313 by a distance. In other words, the underfill 302 is not in contact with the semiconductor die 313. The application of underfill 302 is usually related to the material and the size of the conductive connectors 301 and/or the mechanical property of the semiconductor dies 311 and 312 that the conductive connectors 301 are attached to. In some other embodiments, not illustrated in figures, the underfill 302 covers and surrounds the conductive connectors 301 and 301', so that the spaces between semiconductor dies 311, 312 and 313 are filled with underfill 302. These circumstances are merely for illustration, and the disclosure is not limited thereto.

Referring to FIG. 4, an insulating encapsulant 303 is formed on the dielectric layer 105' of the redistribution structure 107 to encapsulate the conductive connectors 301, 301' and the semiconductor dies 311, 312 and 313 such that an intermediate structure 400 is formed. In some embodiments, the insulating encapsulant 303 includes a molding compound formed by a molding process and plays a similar role as an underfill to protect the conductive connectors 301. The insulating encapsulant 303 laterally encapsulates the semiconductor dies 311, 312 and 313 as well as the underfill 302 such that the semiconductor dies 311, 312 and 313 as well as the underfill 302 may be well protected. In some other embodiments, the insulating encapsulant 303 include epoxy or other suitable materials. As illustrated in FIG. 4, the insulating encapsulant 303 may be formed by an over-mold process followed by a grinding process (e.g., a chemical mechanical polishing process). In the intermediate structure 400, the top surface of the semiconductor die 313 is covered by the insulating encapsulant 303, the top surfaces of the semiconductor dies 311 and 312 are revealed and substantially level with the top surface of the insulating encapsulant 303.

Figure 5:
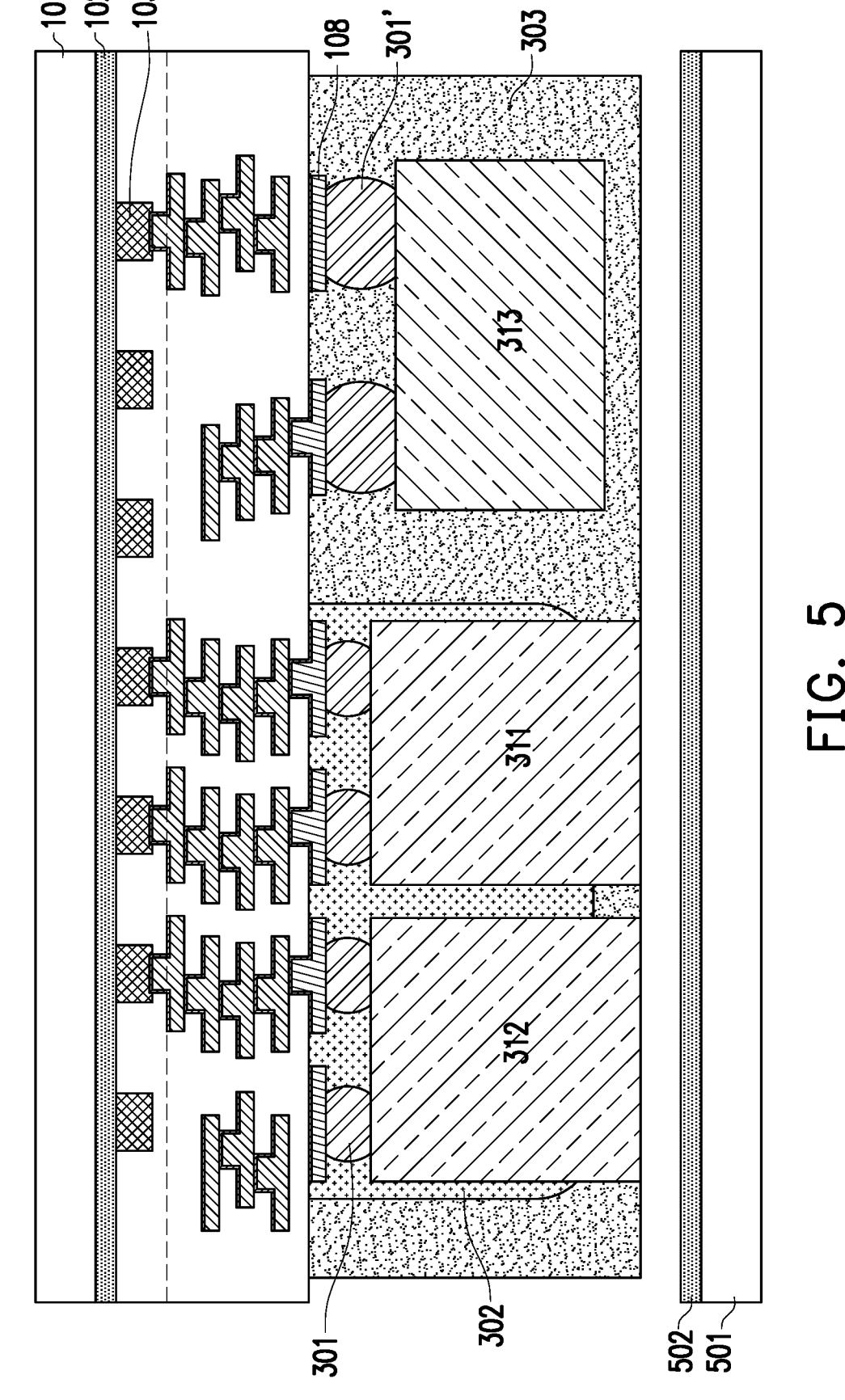

Referring to FIG. 4 and FIG. 5, a carrier 501 including an adhesion layer 502 formed thereon is provided. Then, the intermediate structure 400 shown in FIG. 4 is flipped upside down and attached to the adhesion layer 502 carried by the carrier 501, whereas the carrier 501 may be a semiconductor substrate, a glass substrate, other suitable substrate or a tape that can be mounted on a frame. In some embodiments, the adhesion layer 502 includes a die-attach film (DAF) or the like. For example, the material of the adhesion layer 502 includes phenolic base materials or epoxy base materials. As illustrated in FIG. 5, the revealed top surfaces of the semiconductor dies 311 and 312 are adhered with the adhesion layer 502. Furthermore, the top surface of the insulating encapsulant is adhered with the adhesion layer 502.

Figure 6:
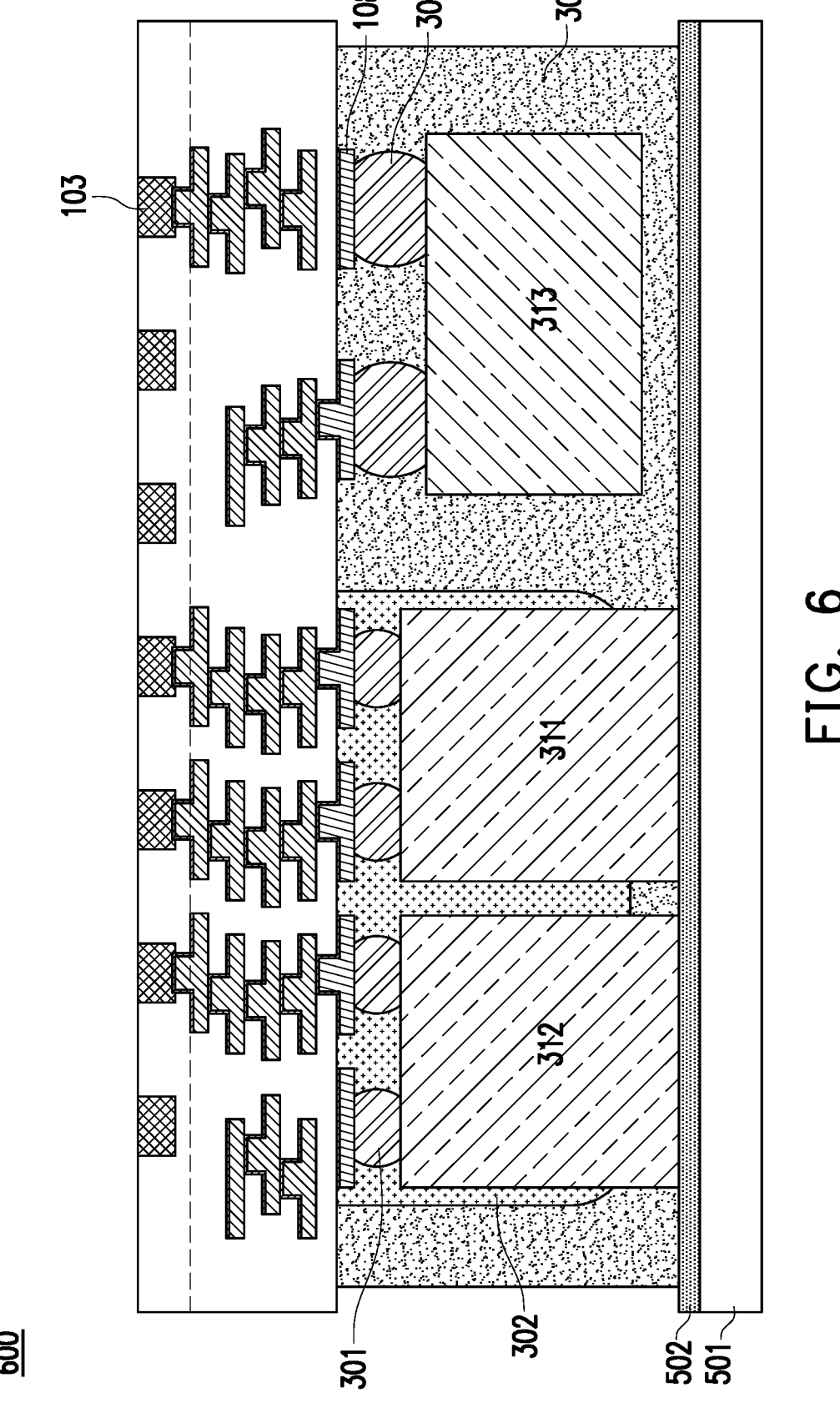

Referring to FIG. 6, after the top surfaces of the semiconductor dies 311 and 312 as well as the top surface of the insulating encapsulant is adhered with the adhesion layer 502, the semiconductor substrate 101 and the de-bonding layer 102 are removed such that an intermediate structure 600 is formed. After the semiconductor substrate 101 and the de-bonding layer 102 are removed, the intermediate structure 400 illustrated in FIG. 4 is transferred bonded onto the carrier 501. The semiconductor substrate 101 is de-bonded from the de-bonding layer 102 such that the semiconductor substrate 101 is separated or delaminated from the redistribution structure 107. In some embodiments, the de-bonding layer 102 (e.g., the LTHC release layer) is irradiated by an UV laser such that the semiconductor substrate 101 is peeled from the de-bonding layer 102. Then, an etch back process may be performed to remove the de-bonding layer 102 form the redistribution structure 107 until the UBM layer 103 embedded in the redistribution structure 107 is exposed. In some embodiments, a plasma ion etch process is performed to remove the de-bonding layer 102, and appropriate etching gases such as $CH_2F_2$, $CH_3F$, $CF_4$, $O_2$, $H_2$, He or the like may be utilized. In some other embodiments, the above-mentioned etch back process involve with a wet etch process, a dry etch process, combinations thereof, or any other applicable processes.

Figures 7, 8:
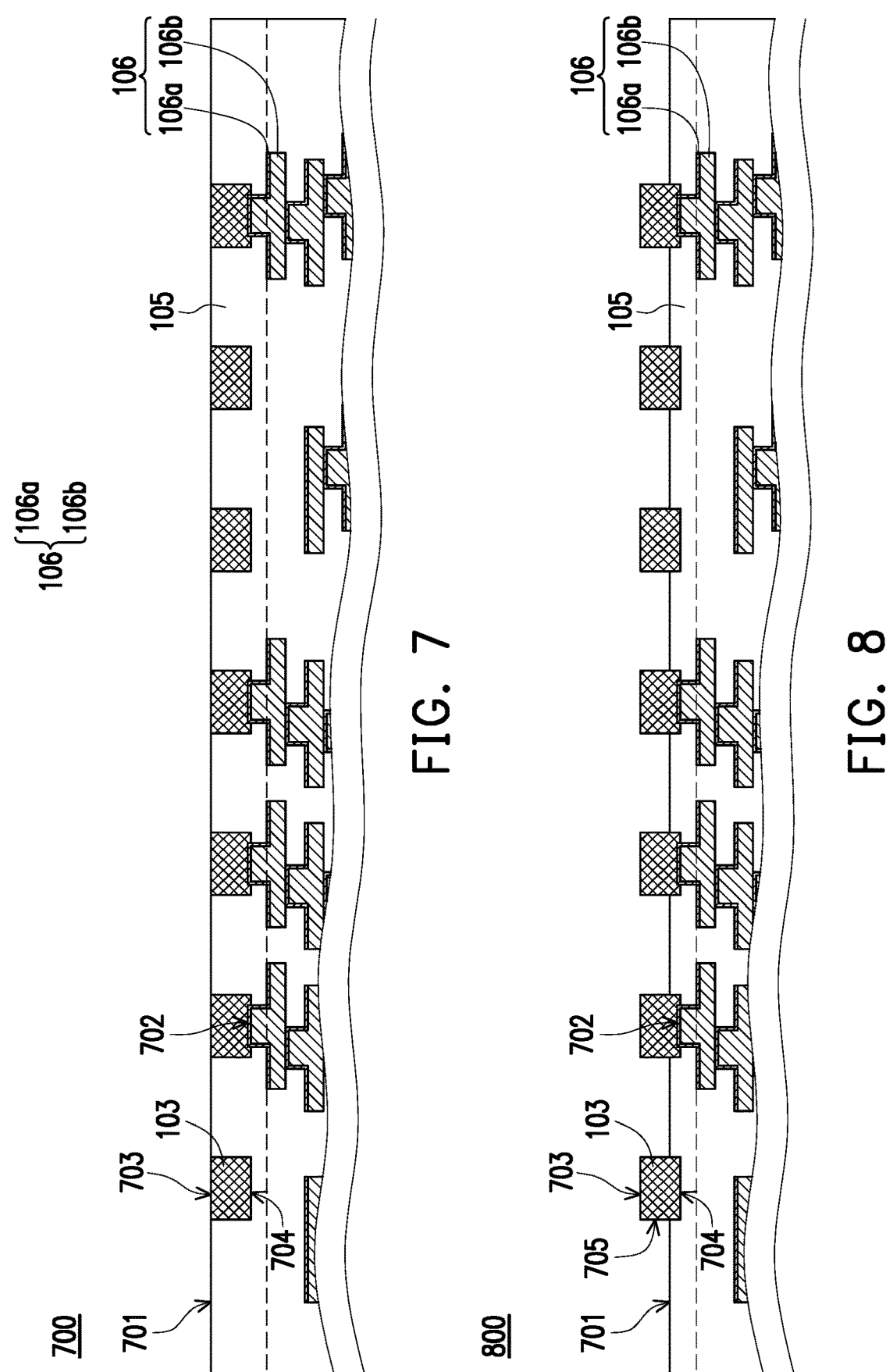

Referring to FIG. 7, a first surface 701 of the dielectric layer 105 is exposed after performing the etch back process such that an intermediate structure 700 is formed. In the intermediate structure, a second surface 702 of the conductive layer 106 is still embedded in the dielectric layer 105. Besides, a third surface 703 of the UBM layer 103 is also exposed after the etch back process while the fourth surface 704 of the UBM layer 103 which is opposite to the third surface 703 is embedded in the dielectric layer 105. The first surface 701 of the dielectric layer 105 and the third surface 703 of the UBM layer 103, as shown in FIG. 7, level with each other in some embodiments.

Figure 9:
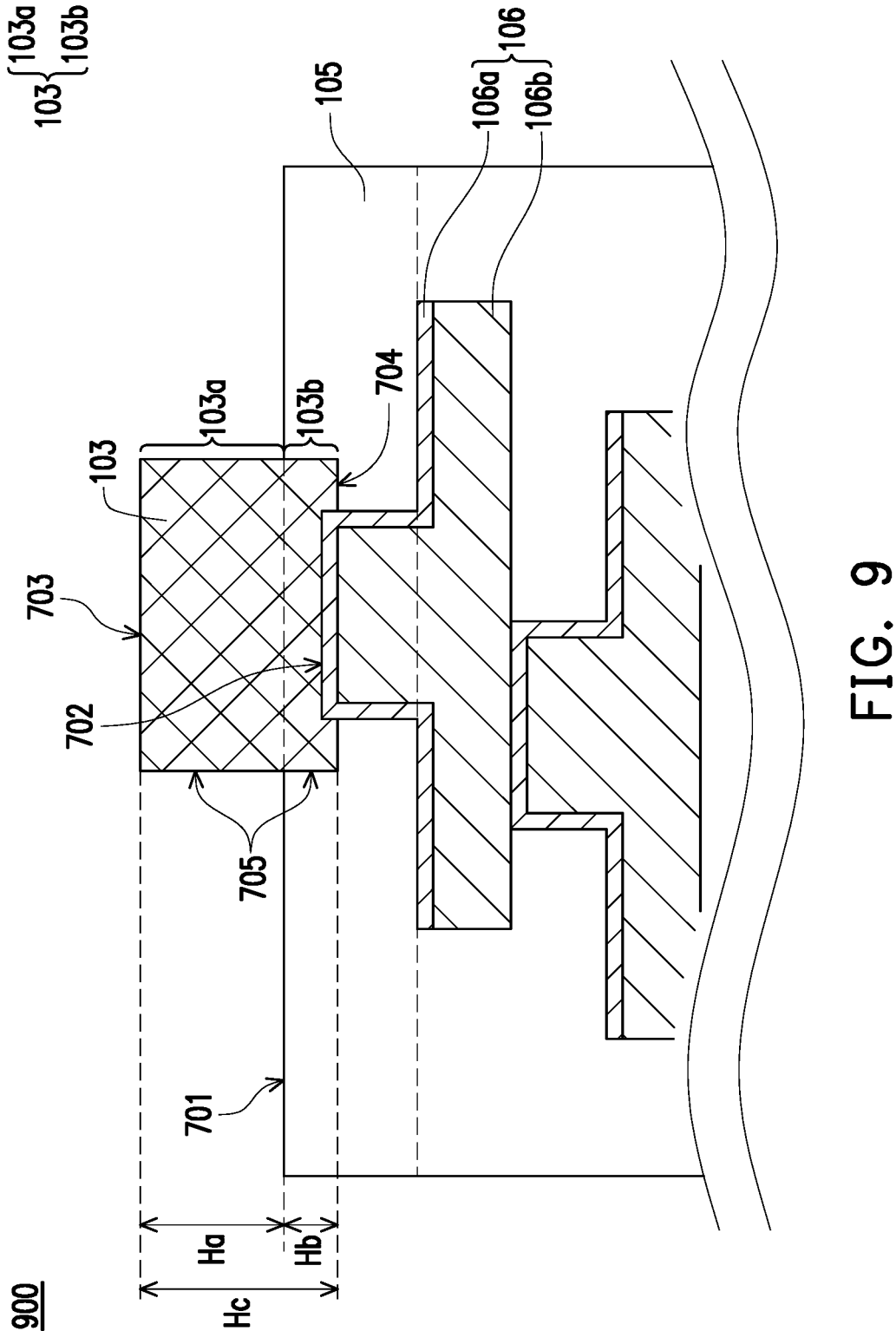

Referring to FIG. 8, a removal process may be performed to remove portions of the dielectric layer 105 such that an intermediate structure 800 is formed. The dielectric layer 105 may be partially removed until sidewall 705 the UBM layer 103 are partially revealed. As illustrated in FIG. 8, due to a selectivity on the materials of the dielectric layer 105 and the UBM layer 103 by the etch back process, the first surface 701 of the dielectric layer 105 is located at a first level height, the third surface 703 of the UBM layer 103 is located at a second level height higher than the first level height. With such etch back process, the impact of intermetallic compound (IMC) diffusion into the interface between the UBM layer 103 and the dielectric layer 105 during the subsequently performed bump formation processes may be reduced. More specifically, as shown in FIG. 9, a portion 103a of the UBM layer 103 is exposed with a height Ha, while another portion 103b of the UBM layer 103 with a height Hb is still embedded in the dielectric layer 105, and the sum of the height Ha and the height Hb equals to the height He of UBM layer. In some embodiments, the range of height He is within about 3 um to about 20 um, and the height Hb is within about 0 um to about 20 um. It is noted that, as illustrated in FIG. 9, in the intermediate structure 900, the conductive layer 106 includes a seed layer 106a and a wiring layer 106b, and the surface 704 of the UBM layer 103 is in contact with the surface 702 of the conductive layer 106, that is, the surface 704 of the UBM layer 103 is in contact with the seed layer 106a of the conductive layer 106. In some other embodiments, not illustrated in figures, the height Hb is zero, and in this case the surface 704 of the UBM layer 103 is still in contact with the seed layer 106a of the conductive layer 106, as well as the surface 701 of the dielectric layer 105.

Figure 10:
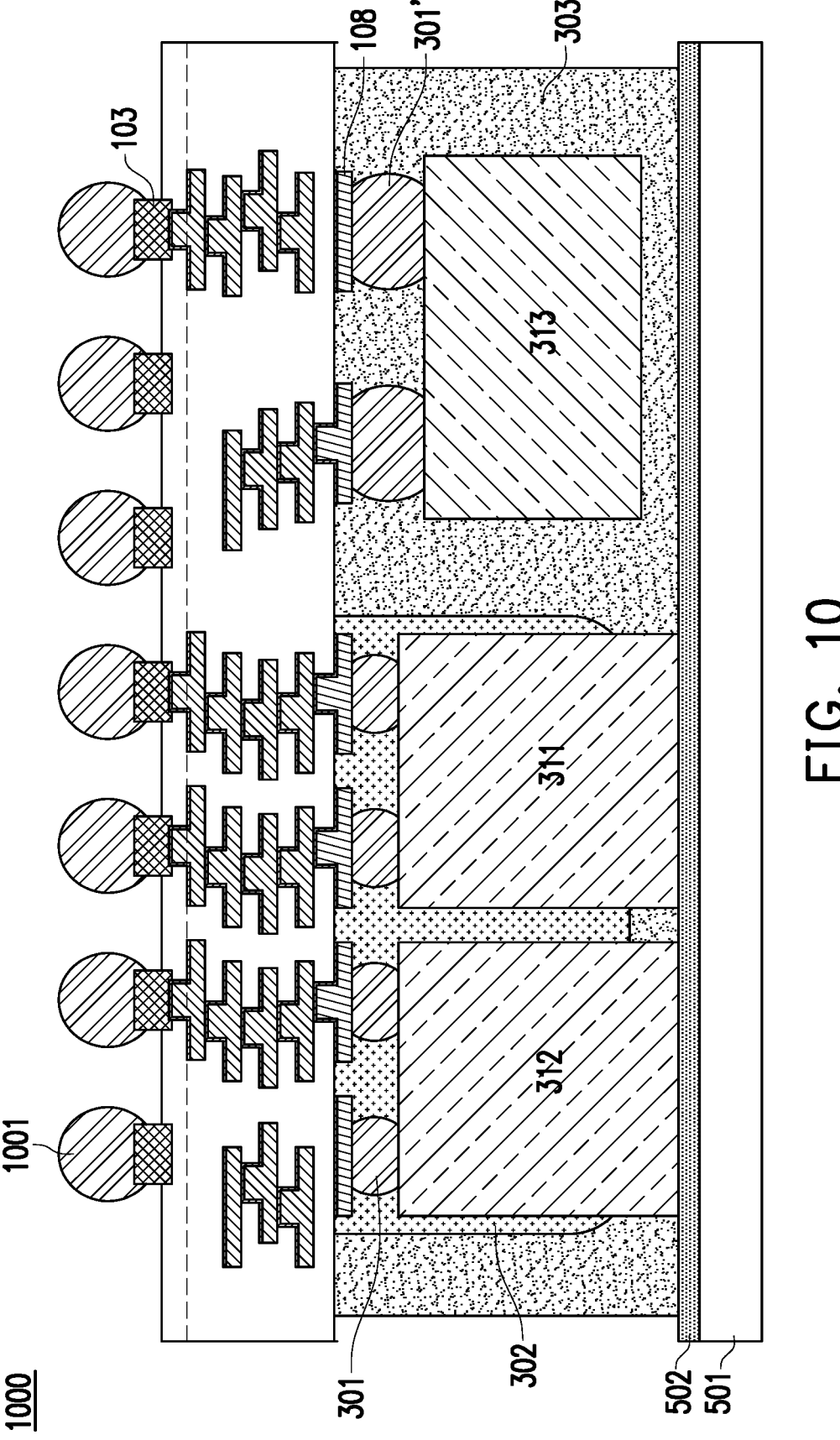

Referring to FIG. 10, connectors 1001 may be formed on the UBM layer 103 for electrical connections to some connectors of subsequently formed devices. After forming the connectors 1001, an intermediate structure 1000 is formed. The connectors 1001 may be solder balls or other metallic balls arranged in array. In some alternative embodiments, other components (not shown) are placed on the UBM layer 103 asides to the connectors 1001 in order to construct a desired system, in this case, these components may include active components or integrated active devices (IAD), passive components or integrated passive devices (IPD).

FIG. 11 through FIG. 20 illustrate a process flow for fabricating an integrated fan-out package in accordance with some other embodiments.

Figures 11, 12:
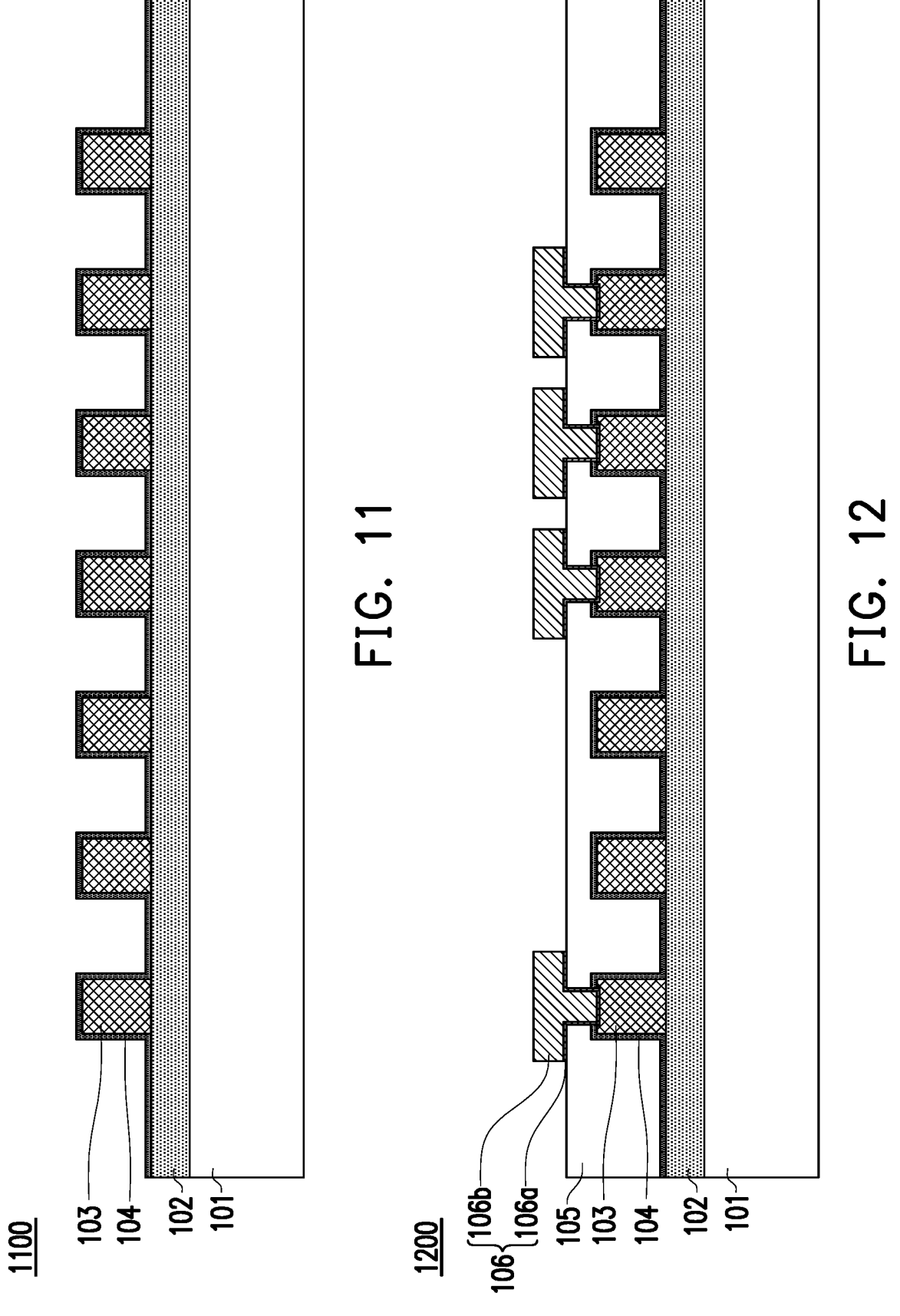
FIG. 11 through FIG. 20 illustrate a process flow for fabricating an integrated fan-out package in accordance with some other embodiments.

Referring to FIG. 11, a semiconductor substrate 101 having a de-bonding layer 102 and a UBM layer 103 formed thereon is provided, wherein the de-bonding layer 102 is formed on a surface of the semiconductor substrate 101. In some embodiments, the semiconductor substrate 101 is a glass substrate or a silicon substrate, and the de-bonding layer 102 is a light-to-heat conversion (LTHC) release layer formed on the semiconductor substrate 101. In alternative embodiments, the de-bonding layer 102 is a photo-curable release film whose viscosity is decreased by photo-curing process or a thermal curable release film whose viscosity is decreased by thermal-curing process. The materials of the de-bonding layer 102, the semiconductor substrate 101 are merely for illustration, and the disclosure is not limited thereto.

As shown in FIG. 11, a under bump metallization (UBM) layer 103 with a plurality of pads is further formed. The UBM layer 103 is disposed over the de-bonding layer 102 and is then patterned into pad structures. In some embodiments, the UBM layer 103 includes Ti, Ta, Cu, W, Ru, Co, Ni or an alloy thereof. In some embodiments, the UBM layer 103 is formed for further electrical connection to some connectors of subsequently formed devices.

An adhesive layer 104 is conformally deposited on the de-bonding layer 102 and the UBM layer 103 such that an intermediate structure 1110 is formed. The adhesive layer 104 may include adhesion promoters to improve the adhesion strength between the conductive layer 106 and the subsequently formed dielectric layer 105 (shown in FIG. 12). In some embodiments, the adhesive layer 104 includes inorganic dielectric materials such as silicon dioxide, silicon nitride, silicon carbide, silicon oxynitride, aluminum nitride, aluminum oxide or the like, but not limited thereto. In some other embodiments, the adhesive layer 104 includes organic dielectric materials such as adhesion promoter, wherein the adhesion promoter may be polymer materials containing silicon. The adhesion promoter material may include a metal chelate compound, such as copper chelate. The metal chelate compound included in the adhesion promoter material is corresponding to the metal included in the UBM layer 103. That is, the adhesive layer 104 and the UBM layer 103 include a same metal element. In some embodiments, the adhesion promoter material is formed by conducting chelation reaction between a chelating agent and the UBM layer 103.

The adhesive layer 104 may be a single layer (e.g., a silicon nitride layer) deposited on the de-bonding layer 102 and the UBM layer 103. In some alternative embodiments, the adhesive layer 104 may be a multi-layered structure deposited on the de-bonding layer 102 and the UBM layer 103. In some embodiments, the above mention multi-layered structure may be a bi-layered structure including an aluminum oxide layer and a silicon dioxide layer deposited on the aluminum oxide layer. In some alternative embodiments, the above mention multi-layered structure may be a bi-layered structure including a silicon nitride layer and a silicon dioxide layer deposited on the silicon nitride layer.

Referring to FIG. 12, a dielectric layer 105, a seed layer 106a and a wiring layer 106b are formed over the adhesive layer 104 and the UBM layer 103 such that an intermediate structure 1200 is formed. The seed layer 106a together with the wiring layer 106b are herein referred to a conductive layer 106 for providing a function of electrical connection in the structure. In some embodiments, the dielectric layer 105 is formed over the adhesive layer 104 to cover the UBM layer 103. In some embodiments, the dielectric layer 105 includes polybenzoxazole (PBO), polyimide (PI), benzocyclobutene (BCB), a nitride such as silicon nitride, an oxide such as silicon oxide, phosphosilicate glass (PSG), borosilicate glass (BSG), boron-doped phosphosilicate glass (BPSG), a combination thereof or the like. In some alternative embodiments, the dielectric layer 105 is made of an inorganic material. The disclosure is not limited thereto.

The dielectric layer 105 may be formed through a deposition process followed by a patterning process. The dielectric layers 105 may be formed by suitable fabrication techniques such as spin-on coating, chemical vapor deposition (CVD), plasma-enhanced chemical vapor deposition (PECVD) or the like. In some embodiments, a patterning process includes a series of lithography processes comprising a coating method, an exposure process, a develop process and a curing method, and/or etching process may be performed on the dielectric layer 105. After performing the patterning process of the dielectric layer 105, openings are formed in the dielectric layer 105 so as to allow the succeeding formed conductive structures connect to other layers. In other words, portions of the UBM layer 103 are revealed by the openings defined in the dielectric layer 105.

As illustrated in FIG. 12, a conductive layer 106 including a seed layer 106a and a wiring layer 106b is formed on the dielectric layer 106 and fills the openings defined in the dielectric layer 105. The seed layer 106a and the wiring layer 106b of the conductive layer 106 may be formed through deposition processes followed by a patterning process. In some embodiments, the seed layer 106a is conformally formed on the surface of the dielectric layer 105. In some embodiments, the seed layer 106a partially fills the openings defined in the dielectric layer 105 and covers portions (e.g., top surfaces) of the UBM layer 103 revealed by the openings defined in the dielectric layer 105. The seed layer 106a is in contact with the adhesive layer 104. In some embodiments, the seed layer 106a is formed by a sputtering method, a deposition method such as physical vapor deposition or other applicable methods. In some embodiments, the above-mentioned patterning process includes a series of lithography processes comprising a coating method, an exposure process, a develop process and a curing method, and/or etching process may be performed on the dielectric layer 105. Through the specification, the seed layer 106a not only serves as a seed for the subsequently formed metal feature, but also provides adhesion between adjacent metal features. Specifically, the seed layer 106a not only serves as a seed for the subsequently formed wiring layer 106b of the conductive layer 106, but also provides sufficient adhesion between the wiring layer 106b and the underlying UBM layer 103. In some embodiments, the material of the seed layer 106a and the wiring layer 106b includes Ti, Ta, Cu, W, Ru, Co, Ni or an alloy thereof, or other suitable choice of materials. In some embodiments, the seed layer 106a includes Ti/Cu, and the wiring layer 106b includes Cu. In some embodiments, as illustrated in FIG. 12, ends of the adhesive layer 104 which are in proximity to the openings defined in dielectric layer 105 are in contact with the seed layer 106a.

Figure 13:
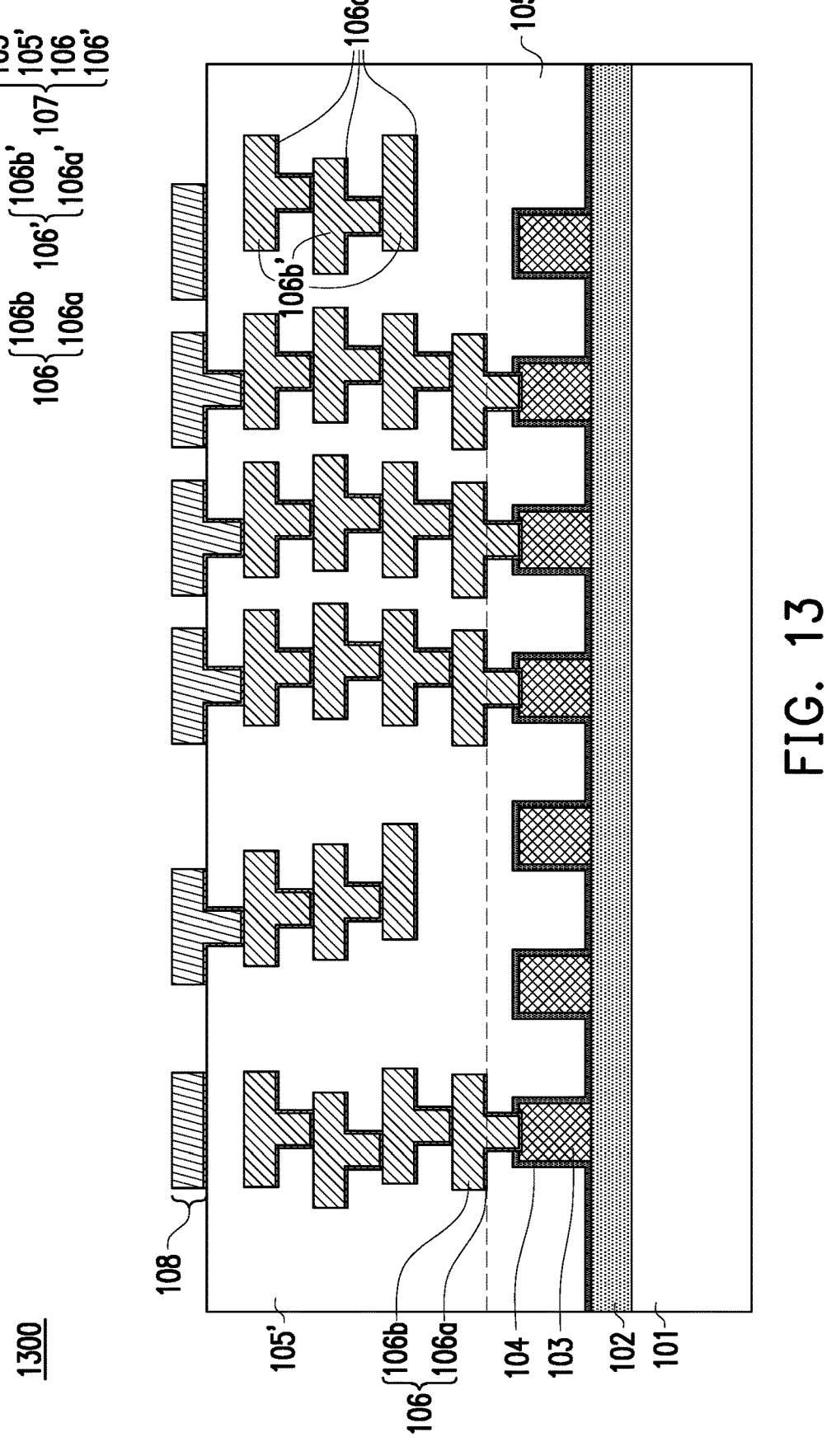
Figure 14:
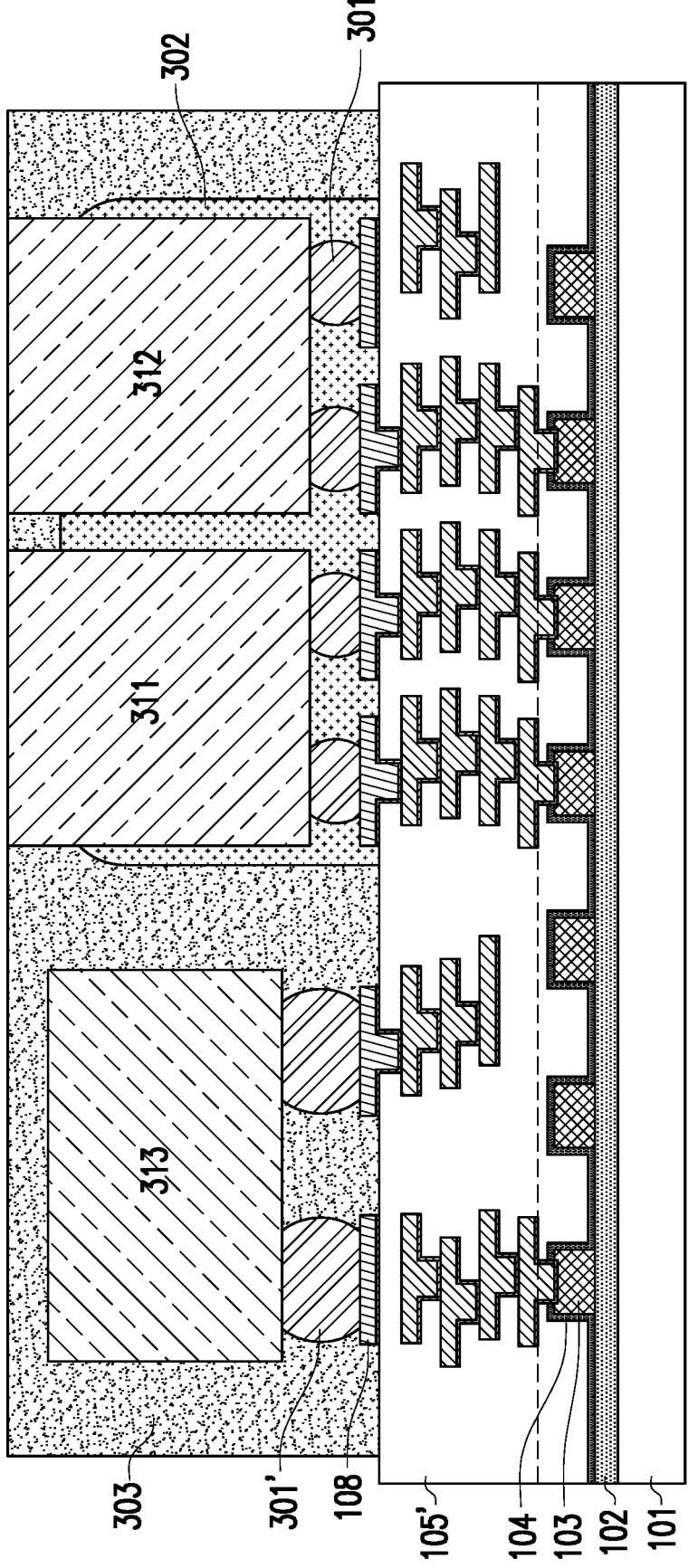
Figure 15:
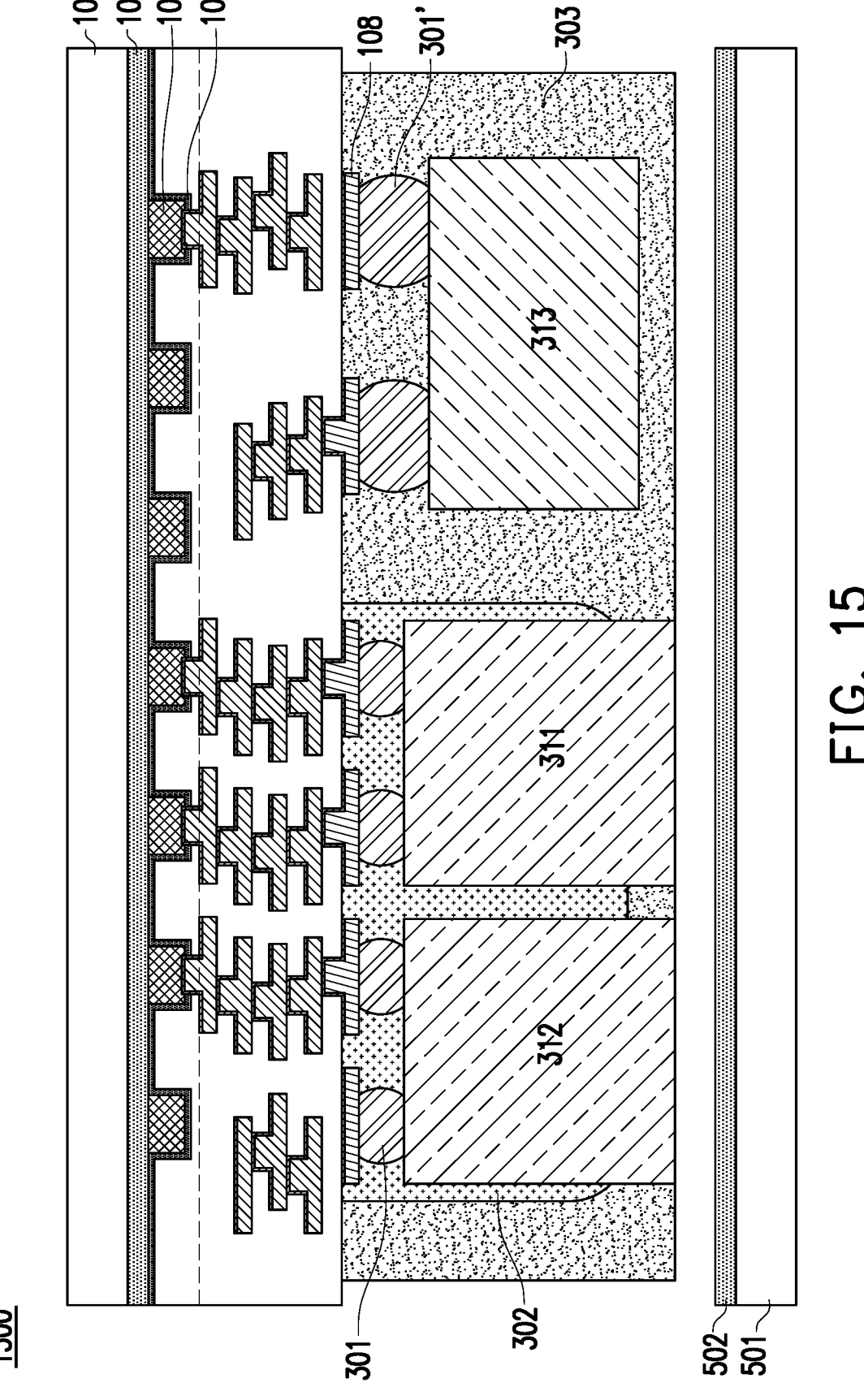
Figure 16:
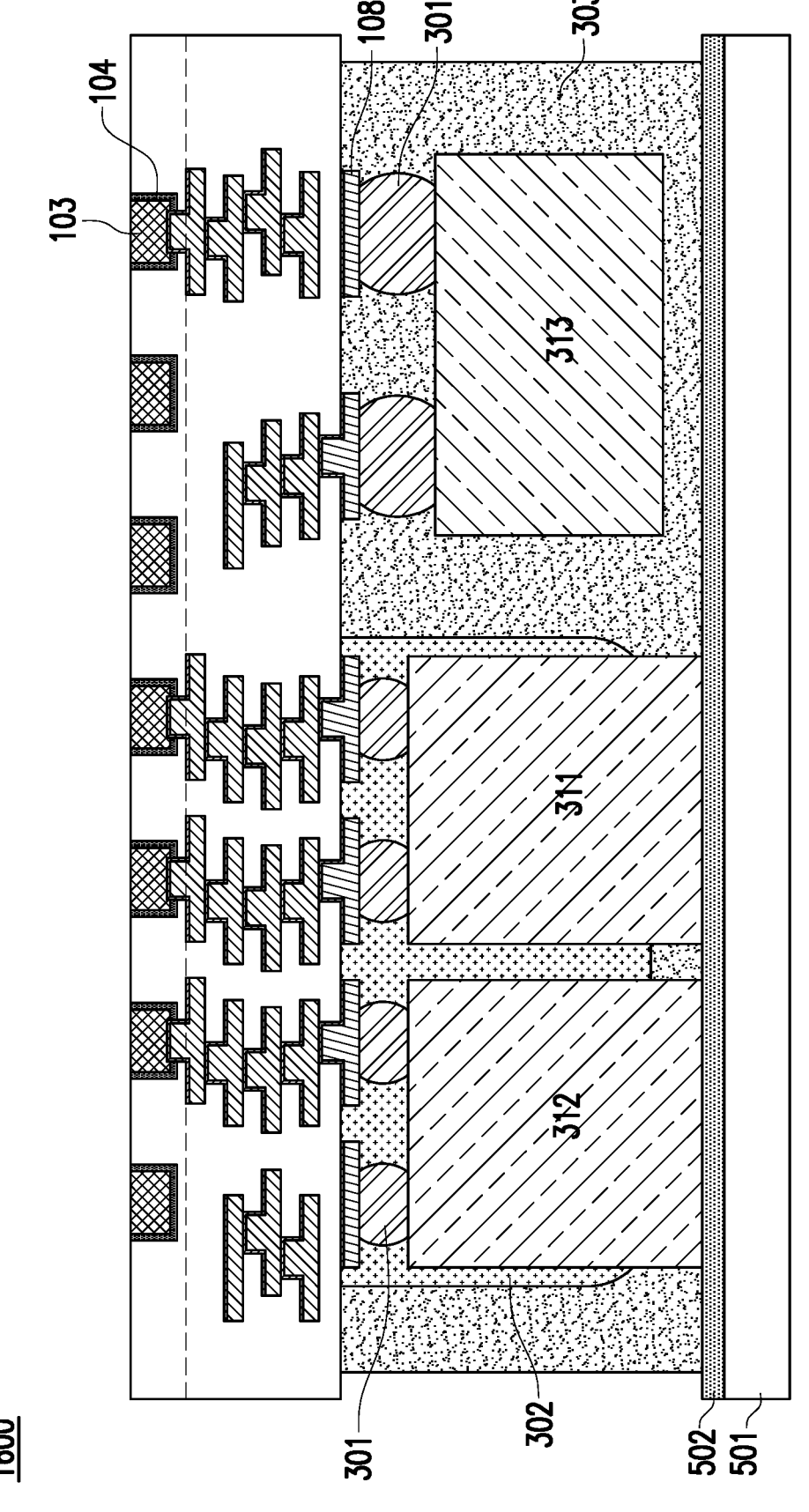

Referring to FIG. 13, in the intermediated structure 1300, one or more dielectric layers 105' and conductive layers 106' are alternately stacked thereafter, so that a redistribution structure 107 including the dielectric layers 105, 105' and the conductive layers 106, 106' is formed. In addition, an UBM layer 108 is then formed over the topmost surface of the dielectric layer 105' in some embodiments. In another exemplary embodiment, the processes in FIG. 14 to FIG. 16 are similar to those in FIG. 4 to FIG. 6, including attaching semiconductor dies to intermediate structure 1300, applying underfill and/or insulating encapsulant over the attached semiconductor dies and on the dielectric layer 105' in intermediate structure 1400, flipping and attaching the intermediate structure 1400 to a second carrier 501, removing the semiconductor substrate 101 and de-bonding layer 102 and performing an etch back process on intermediate structure 1500 to expose the UBM layer 103 together with the adhesive layer 103, as shown in intermediate structure 1600 and so on, except the existence of the adhesive layer 104 in contact with the UBM layer 103 in each step. For simplicity, the description is not repeated herein.

Figures 17, 18:
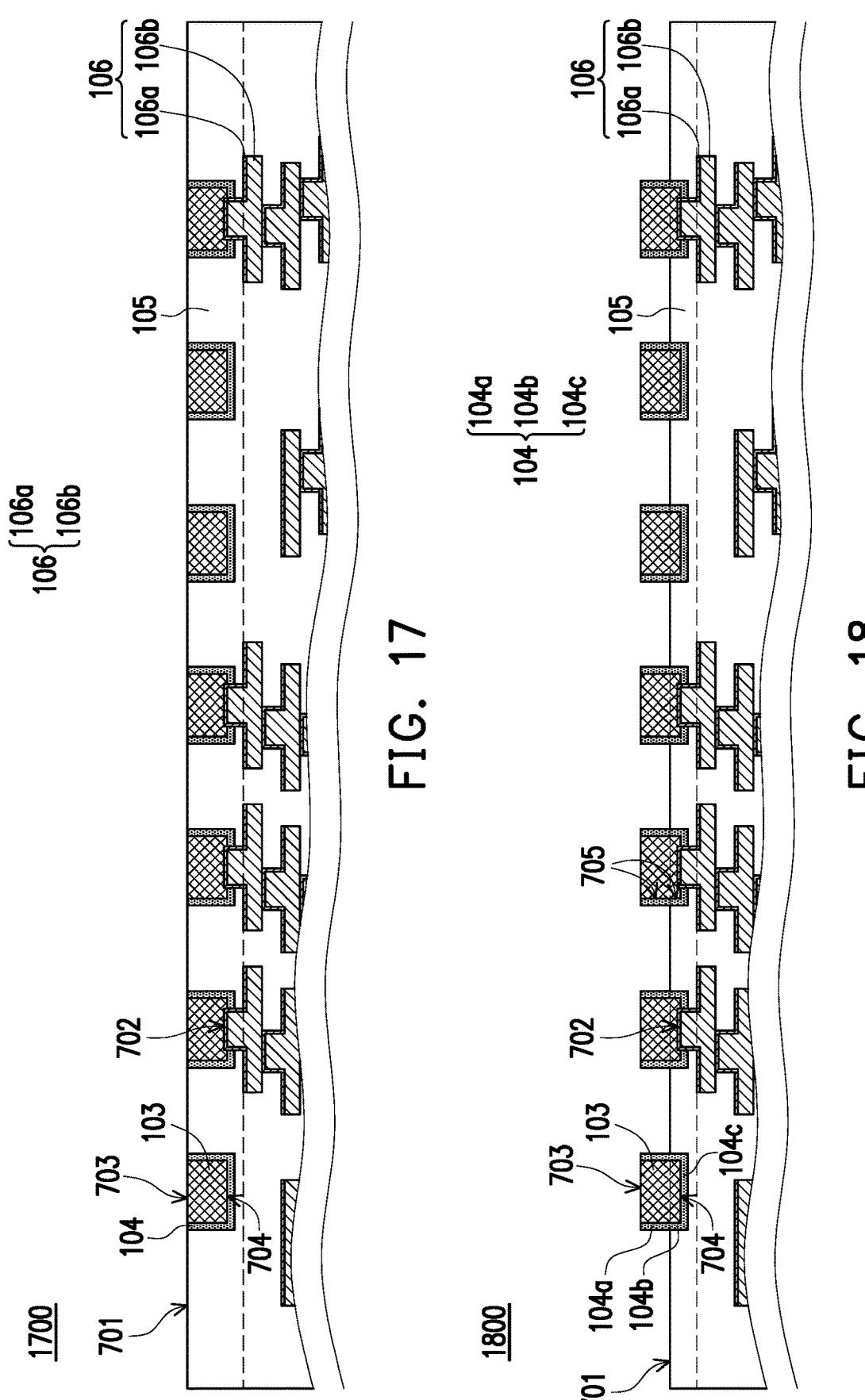

Referring FIG. 17, in some embodiments, after the UBM layer 103 is exposed by the etch back process, a first surface 701 of dielectric layer 105 is also exposed, as shown in the intermediate structure 1700. However, the surface 702 of the conductive layer 106 is still embedded in the dielectric layer 105 and is not exposed. Surface 703 of the UBM layer 103 is exposed while another surface 704 of the UBM layer 103 opposite to 703 is embedded in the dielectric layer 105. An end of the adhesive layer 104 is in contact with the surface 704 of UBM layer, the dielectric layer 105, and the seed layer 106a. Besides, a portion of the adhesive layer 104 is exposed together with the UBM layer 103 after the etch back process, as shown in this intermediate structure 1700.

Referring to FIG. 18, in the intermediate structure 1800, the surface 701 of dielectric layer 105 and the surface 703 of the UBM layer 103 may locate at different level heights. In other words, the surface 701 of dielectric layer 105 does not level with and the surface 703 of the UBM layer 103. The sidewall 705 of the UBM layer 103 may be covered by the adhesive layer 104, while the adhesive layer 104 is exposed by the dielectric layer 105. More specifically, the adhesion layer 104 includes a first sidewall portion 104a that is exposed by the dielectric layer 105, a second sidewall portion 104b embedded in the dielectric layer 105, and a bottom portion 104c. The sidewall 705 of UBM layer is covered by the portions 104a and 104b of the adhesive layer 104, and the surface 704 of UBM layer is covered by the portion 104c of the adhesive layer 104.

Figure 19A:
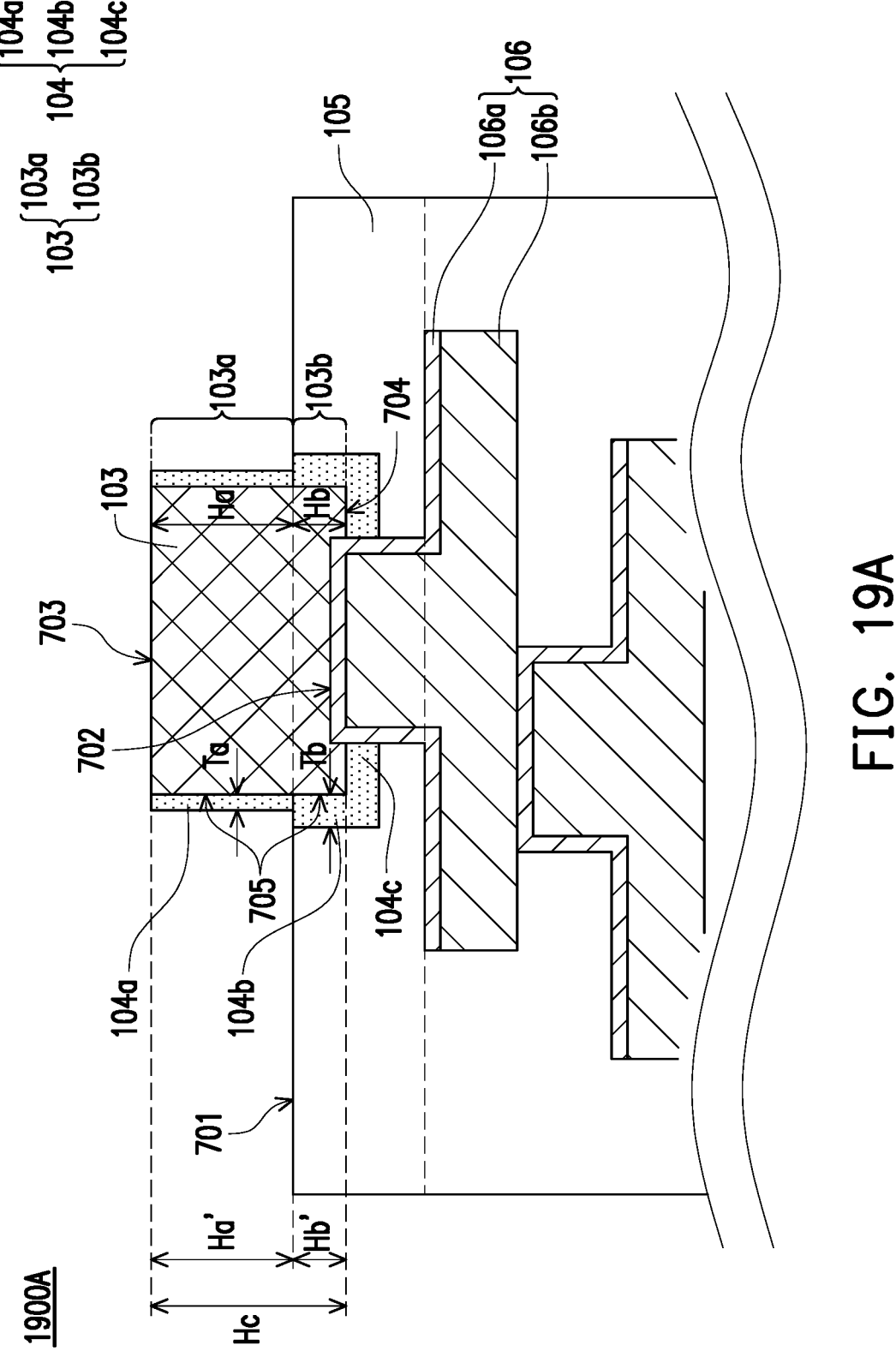

As shown in the intermediate structure 1900A in FIG. 19A, a portion 103a of UBM layer is with a height Ha, which is the distance between the plane of surface 701 and the surface 703, or the height that UBM layer 103 protrude from the top surface of the dielectric layer 105. Another portion 103b of UBM layer is with a height Hb, where a sum of Ha and Hb equals to the height He of the UBM layer 103. On the other hand, the adhesion layer 104 includes a first sidewall portion 104a that is exposed by the dielectric layer 105, a second sidewall portion 104b embedded in the dielectric layer 105, and a bottom portion 104*c* in contact with the surface 704, the dielectric layer 105 and the seed layer 106*a*.

Figure 19B:
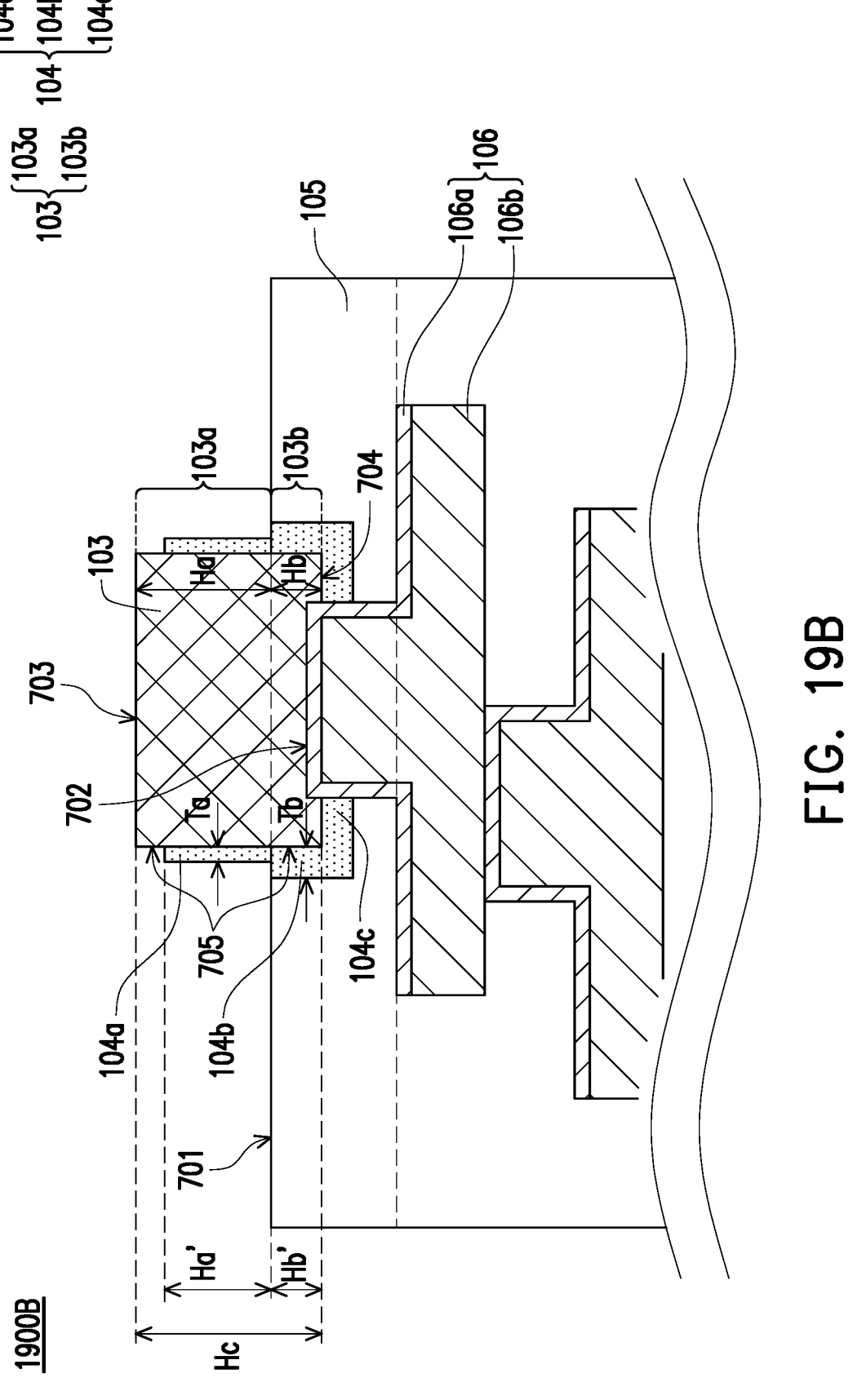

Moreover, in some embodiments, the portion 104*a* of the adhesive layer 104 is with a height Ha' and a thickness Ta, and the portion 104*b* of the adhesive layer 104 is with a height Hb' and a thickness Tb, as shown in the intermediate structure 1900A of FIG. 19A. Hb' substantially equals to Hb of the portion 103*b* of the UBM layer 103, while the thickness Ta may be different from the thickness Tb. In another embodiment, the height Ha' of portion 104*a* of adhesive layer 104 is less than or equal to the height Ha of portion 103*a* of UBM layer 103 due to the selectivity of etch back process to the materials of adhesive layer 104, UBM layer 103 and the dielectric layer 105, as shown in FIG. 19B. In some other embodiments, not illustrated in figures, the portion 104*a* of the adhesive layer 104 may include a tapered sidewall.

In some embodiments, the range of heights He is within about 3 um to about um, and the height Hb is within about 0 um to about 20 um. The range of thickness Ta is within about 0 nm to about 200 nm, and the thickness Tb is within about 0 nm to about 200 nm.

Figure 20:
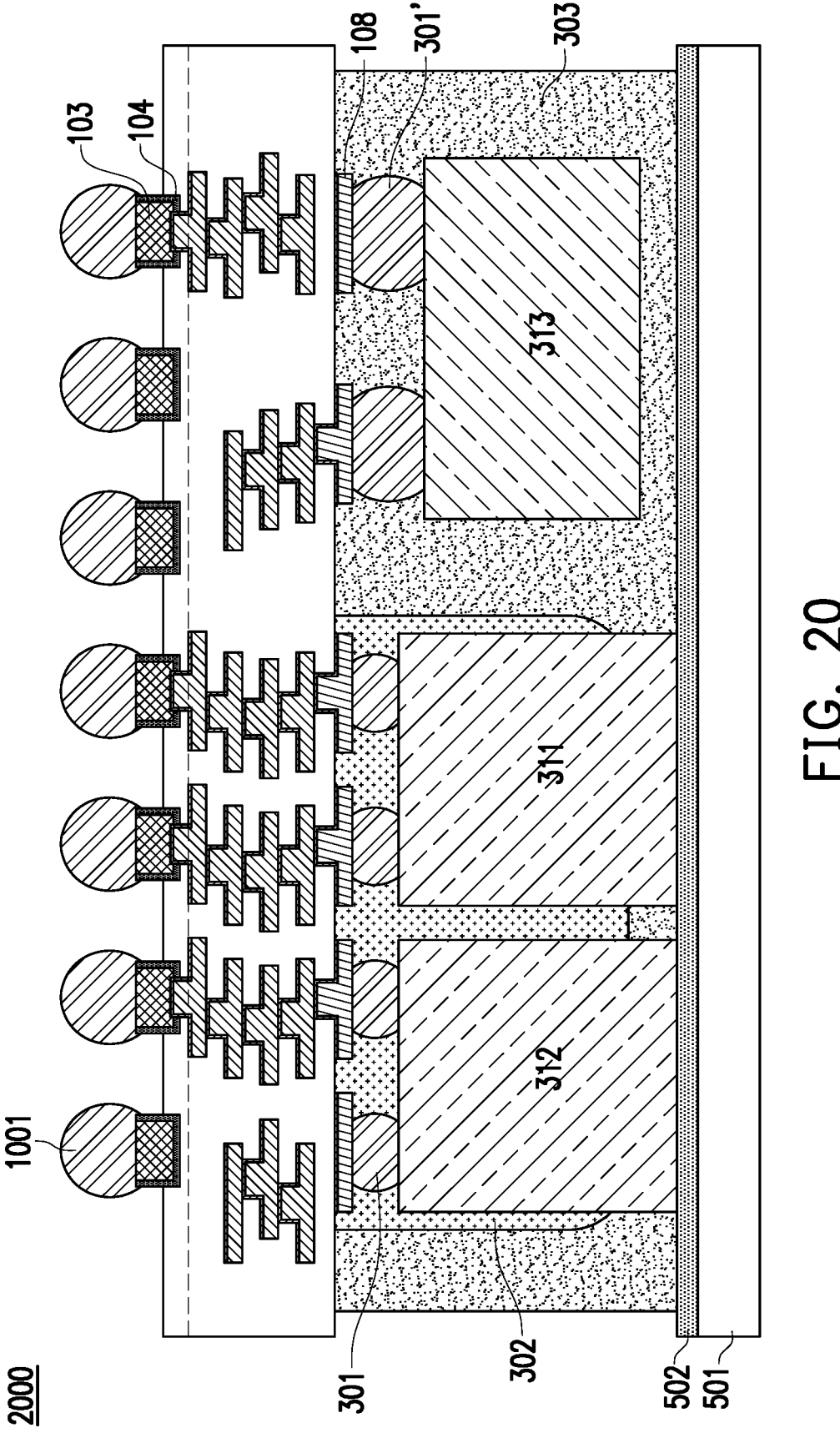

Referring to FIG. 20, a connector structure 1001 may be further attached on the UBM layer 103 for electrical connections to some connectors of subsequently formed devices. In alternative embodiments, other components (not shown) are placed on the UBM layer 103 asides to the connector structures 1001 in order to construct a desired system, in this case, these components may include active components or integrated active devices (IAD), passive components or integrated passive devices (IPD), or the like.

In some embodiments, the UBM layer 103 is formed before the fabrication of the redistribution structure 107, which enhances the robustness of the process steps such as electroplating or metallic material sputtering due to a better wafer edge condition on a substrate only a few layers on, and thus further improve the ability of process control or line yield in the following steps.

According to some embodiments, a structure including a redistribution structure comprising dielectric layers and conductive layers alternately stacked is provided, wherein a dielectric layer among the dielectric layers of the redistribution structure comprises a first surface, a conductive layer among the conductive layers of the redistribution structure comprising a second surface, and the conductive layer comprises a wiring layer and a seed layer; and an under-bump metallization (UBM) layer comprises a third surface, a fourth surface opposite to the third surface, and a sidewall surface extending from the third surface to the fourth surface, wherein a portion of the seed layer is between the wiring layer and the UBM layer, and the UBM is in contact with the dielectric layer.

According to some embodiments, a structure including a redistribution structure comprising dielectric layers and conductive layers alternately stacked is provided, wherein a dielectric layer among the dielectric layers of the redistribution structure comprises a first surface, a conductive layer among the conductive layers of the redistribution structure comprises a second surface, and the conductive layer comprises a wiring layer and a seed layer; an under-bump metallization (UBM) layer, wherein a portion of the seed layer is between the wiring layer and the UBM layer, and the portion of the seed layer is in contact with the UBM layer as well as the wiring layer; an adhesive layer disposed between the UBM layer and the dielectric layer, wherein the adhesive layer is in contact with the UBM layer and the seed layer of the conductive layer.

According to some embodiments, a method of forming a package structure includes forming a first under-bump metallization (UBM) layer over a carrier; forming a redistribution structure comprising dielectric layers and conductive layers alternately stacked over the carrier, wherein a dielectric layer among the dielectric layers of the redistribution structure comprises a first surface, a conductive layer among the conductive layers of the redistribution structure comprises a second surface, and the conductive layer comprises a wiring layer and a seed layer; forming a second UBM layer over the redistribution structure, wherein the first UBM layer and the second UBM layer are disposed on opposite sides of the redistribution structure; attaching semiconductor dies to the second UBM layer; laterally encapsulating the semiconductor dies with an insulating encapsulant; and de-bonding the insulating encapsulant from the carrier to expose the first UBM layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure, comprising:
   a redistribution structure comprising dielectric layers and conductive layers alternately stacked, wherein a dielectric layer among the dielectric layers of the redistribution structure comprises a first surface, a conductive layer among the conductive layers of the redistribution structure comprises a second surface, and the conductive layer comprises a wiring layer and a seed layer;
   an under-bump metallization (UBM) layer comprising a third surface, a fourth surface opposite to the third surface, and a sidewall surface extending from the third surface to the fourth surface, wherein the second surface of the conductive layer is located at a first level height, the third surface of the UBM layer is located at a second level height, the fourth surface of the UBM layer is located at a third level height, and the first level height is between the second level height and the third level height, and
   an adhesive layer disposed between the UBM layer and the dielectric layer.

2. The semiconductor package according to claim 1, wherein a portion of the seed layer is located between the wiring layer and the UBM layer.

3. The semiconductor package according to claim 1, wherein an end of the adhesive layer is in contact with the seed layer of the conductive layer.

4. The semiconductor package according to claim 1, wherein the first surface of the dielectric layer levels with the third surface of the UBM layer.

5. The semiconductor package according to claim 1, wherein the UBM layer is embedded in the dielectric layer; a first portion of the sidewall surface of the UBM layer is in contact with the dielectric layer and a second portion of the sidewall surface of the UBM layer is exposed from the dielectric layer.

6. The semiconductor package according to claim 1, wherein the fourth surface of the UBM layer is in contact with the dielectric layer, and the sidewall surface of the UBM layer is partially exposed from the dielectric layer.

7. A structure, comprising:
   a redistribution structure comprising dielectric layers and conductive layers alternately stacked, wherein a dielectric layer among the dielectric layers of the redistribution structure comprises a first surface, a conductive layer among the conductive layers of the redistribution structure comprises a second surface, and the conductive layer comprises a wiring layer and a seed layer;
   an under-bump metallization (UBM) layer;
   an adhesive layer disposed between the UBM layer and the dielectric layer, wherein a portion of the seed layer penetrates through the adhesive layer and extends partially into the UBM layer.

8. The semiconductor package according to claim 7, wherein the UBM layer further comprises a sidewall surface, a third surface, a fourth surface opposite to the third surface, a distance between the first surface and the second surface equals to the height of the UBM layer, and the third surface of UBM layer levels with the first surface of the dielectric layer.

9. The semiconductor package according to claim 7, wherein a first portion of sidewall of the adhesive layer comprises a first height and a first thickness, a second portion of sidewall of the adhesive layer comprises a second height and a second thickness, and a sum of the first height and the second height equals to the height of the UBM layer.

10. The semiconductor package according to claim 9, where in the first portion and the second portion are in contact with the dielectric layer.

11. The semiconductor package according to claim 9, where in the first portion is in contact with the dielectric layer and the second portion is exposed from the dielectric layer.

12. The semiconductor package according to claim 9, where in the first portion and the second portion both expose from the dielectric layer.

13. The semiconductor package according to claim 9, where in the first thickness substantially equals to the second thickness.

14. The semiconductor package according to claim 9, where in the first thickness is less than the second thickness.

15. The semiconductor package according to claim 9, wherein a first portion of sidewall of the adhesive layer comprises a first height and a first thickness, a second portion of sidewall of the adhesive layer comprises a second height and a second thickness, and a sum of the first height and the second height is less than the height of the UBM layer.

16. A structure, comprising:
   a redistribution structure comprising dielectric layers and conductive layers alternately stacked, wherein a conductive layer among the conductive layers comprises a wiring layer and a seed layer;
   an under-bump metallization (UBM) layer, wherein a first portion of the seed layer is embedded in the UBM layer, and the wiring layer is spaced apart from the UBM layer by the first portion of the seed layer, and the first portion of the seed layer is in contact with the UBM layer as well as the wiring layer, and
   an adhesive layer disposed between the UBM layer and a dielectric layer among the dielectric layers.

17. The semiconductor package according to claim 16, wherein the seed layer further comprises a second portion connected to the first portion of the seed layer, the wiring layer is spaced apart from the dielectric layer among the dielectric layers by the second portion of the seed layer, and the second portion of the seed layer is in contact with the dielectric layer among the dielectric layers as well as the wiring layer.

18. The semiconductor package according to claim 16, wherein the adhesive layer is in contact with the UBM layer and the seed layer of the conductive layer among the conductive layers.

19. The semiconductor package according to claim 18, wherein the UBM layer and the adhesive layer protrude from a surface of the dielectric layer among the dielectric layers.

20. The semiconductor package according to claim 16, wherein the first portion of the seed layer protrudes above a surface of the UBM layer and into the UBM layer.

* * * * *